United States Patent [19]

McElroy

[11] 4,198,695
[45] Apr. 15, 1980

[54] STATIC SEMICONDUCTOR MEMORY CELL USING DATA LINES FOR VOLTAGE SUPPLY

[75] Inventor: David J. McElroy, Houston, Tex.

[73] Assignee: Texas Instruments Incorporated, Dallas, Tex.

[21] Appl. No.: 925,892

[22] Filed: Jul. 19, 1978

[51] Int. Cl.² .............................................. G11C 11/40
[52] U.S. Cl. .................................. 365/154; 307/279; 357/41; 357/45
[58] Field of Search ....................... 365/154, 190, 205; 307/279, 291, 238; 357/41, 45

[56] References Cited
U.S. PATENT DOCUMENTS

| | | | |
|---|---|---|---|
| 3,292,008 | 12/1966 | Rapp | 365/154 |
| 3,530,443 | 9/1970 | Crafts et al. | 365/154 |
| 3,949,383 | 4/1976 | Askin et al. | 365/154 |

OTHER PUBLICATIONS

Gaensslen et al., FET Memory Cell, IBM Technical Disclosure Bulletin, vol. 13, No. 7, p. 1751, 12/70.

*Primary Examiner*—Stuart N. Hecker
*Attorney, Agent, or Firm*—John G. Graham

[57] ABSTRACT

A semiconductor memory circuit includes two cross coupled driver transistors with storage nodes connected to data lines by coupling transistors, providing a static RAM cell. Load resistors are connected from the storage nodes to the data lines rather than to a voltage supply, and the data lines are maintained at an intermediate voltage level in standby operation. The intermediate voltage is sufficient to hold the driver transistors in a stable state, one conducting and one off.

3 Claims, 9 Drawing Figures

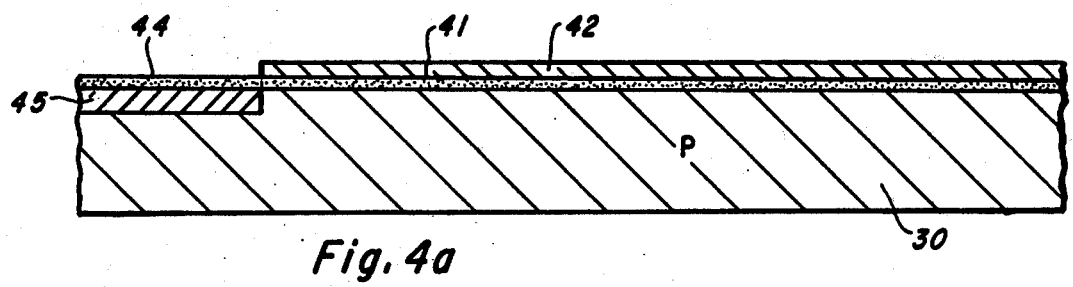
Fig. 4a
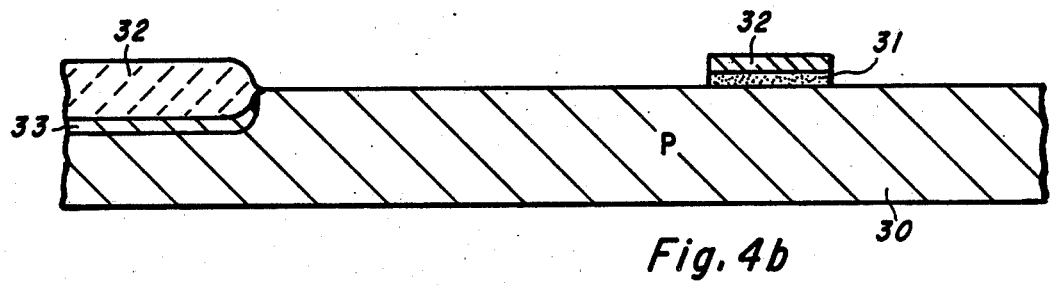
Fig. 4b
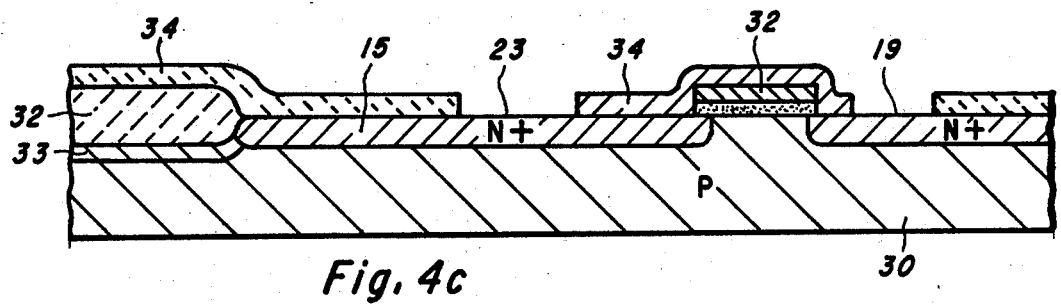
Fig. 4c
Fig. 4d
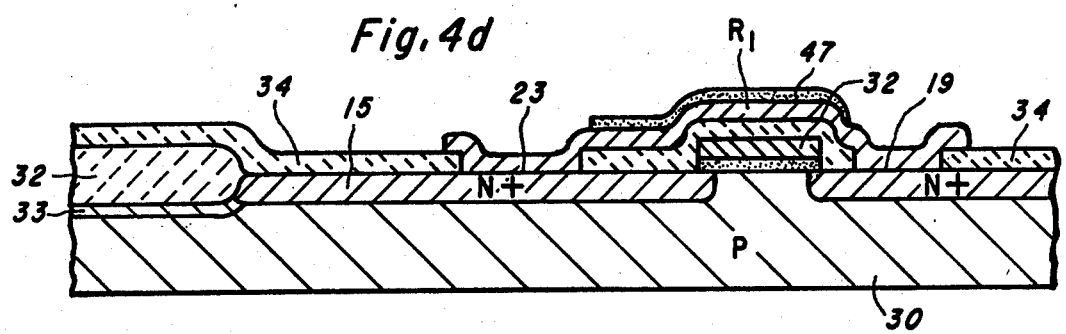

STATIC SEMICONDUCTOR MEMORY CELL USING DATA LINES FOR VOLTAGE SUPPLY

BACKGROUND OF THE INVENTION

This invention relates to semiconductor memory devices, and more particularly to an improved static MOS RAM.

In the semiconductor memory devices used in small minicomputers and microprocessor systems, static memory has an advantage compared to dynamic memory in that static does not require refresh. Dynamic MOS RAMs employ one-transistor cells compared to six transistor cells in static RAMs, so the dynamic devices are much lower in cost because higher densities are achieved on smaller bar sizes. Unfortunately, the storage capacitors in dynamic cells leak charge and the data must be periodically refreshed by addressing each row of a memory array. In large memory systems, the circuitry required for refresh is small in proportion, but in the small memory associated with microcomputers or small minicomputers the refresh control circuitry is a significant portion of the system cost, so static RAMs must be used. Previous attempts to reduce the cell size in static or pseudo static RAMs to make them more comp table with dynamic RAMs include the following patents or applications, all assigned to Texas Instruments:

U.S. Pat. No. 3,995,181 issued to Joseph H. Raymond, Jr.

Ser. No. 671,252, filed May 28, 1976 by G. R. Mohan Rao, now U.S. Pat. No. D246,679.

Ser. No. 727,116, filed Sept. 27, 1976 by Rao et. al. now U.S. Pat. No. 4,110,776.

Ser. No. 762,916, filed Jan. 27, 1977 by David J. McElroy, now U.S. Pat. No. 4,142,111.

It is a principal object of this invention to provide improved memory devices made in a semiconductor integrated circuits. Another object is to provide an improved "static" type MOS memory device, particularly a memory device of small cell size. An additional object is to provide a method of making small area pseudo static memory elements in semiconductor integrated circuits.

SUMMARY OF THE INVENTION

In accordance with an embodiment of this invention, a semiconductor memory circuit includes two cross coupled driver transistors with storage nodes connected to data lines by coupling transistors, providing a static RAM cell. Load resistors are connected from the storage nodes to the data lines rather than to a voltage supply, and the data lines are maintained at an intermediate voltage level in standby operation. The intermediate voltage is sufficient to hold the driver transistors in a state, one conducting and one off.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawing, wherein:

FIGS. 4a–4d are elevation views in section of the semiconductor device of FIGS. 1 and 3a–3c, at successive stages in the manufacturing process, taken generally along the line c—c in FIG. 1.

DETAILED DESCRIPTION OF SPECIFIC EMBODIMENT

Figure 1:
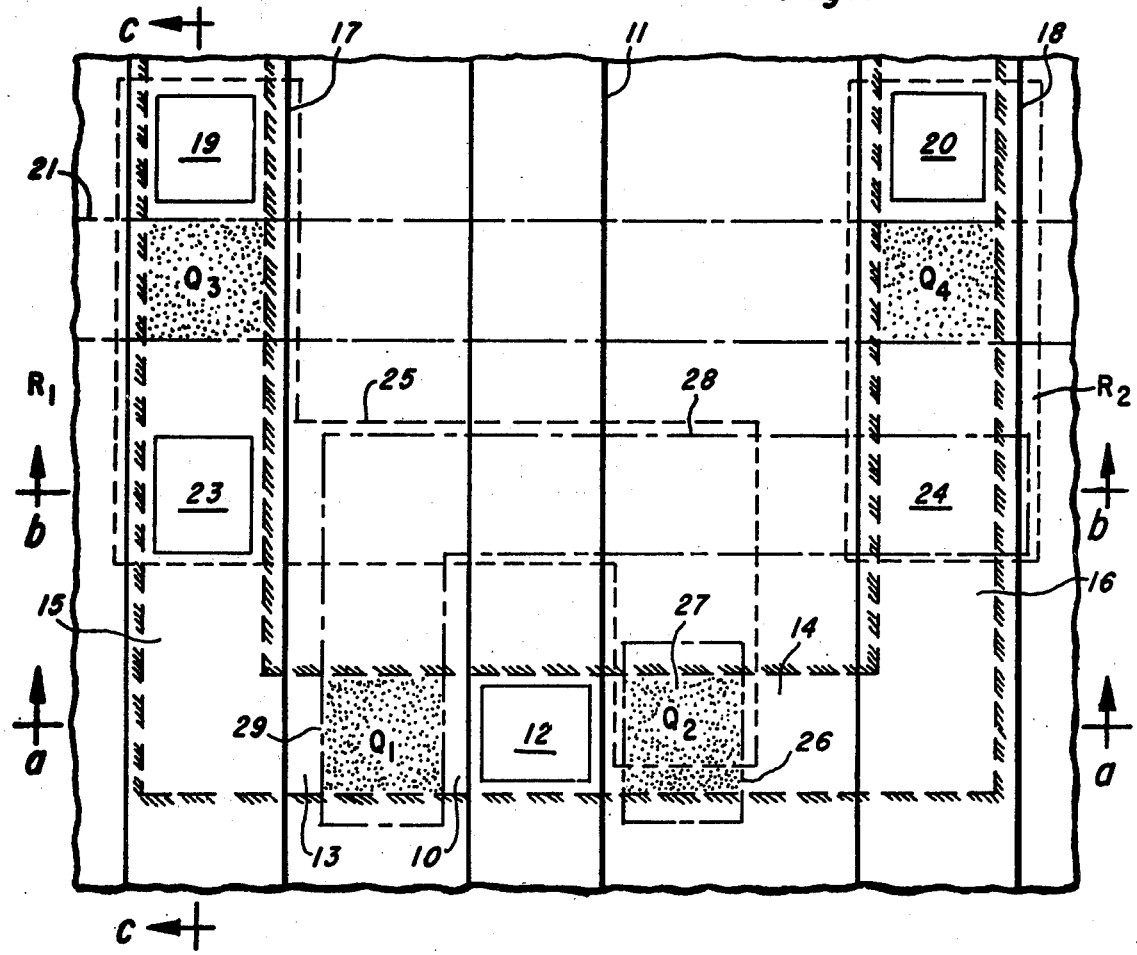
FIG. 1 is a greatly enlarged plan view of a small portion of a semiconductor chip showing the physical layout of a part of a static memory array made according to one embodiment of the invention.
Figure 2:
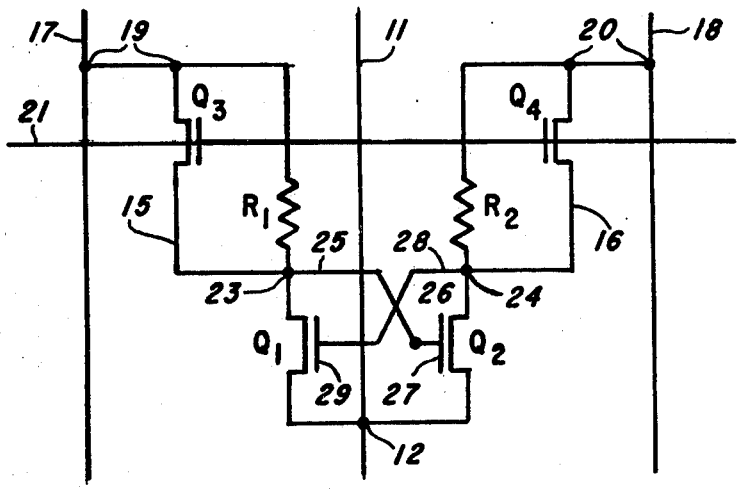
FIG. 2 is an electrical schematic diagram of the cell of FIG. 1.
Figure 3A:
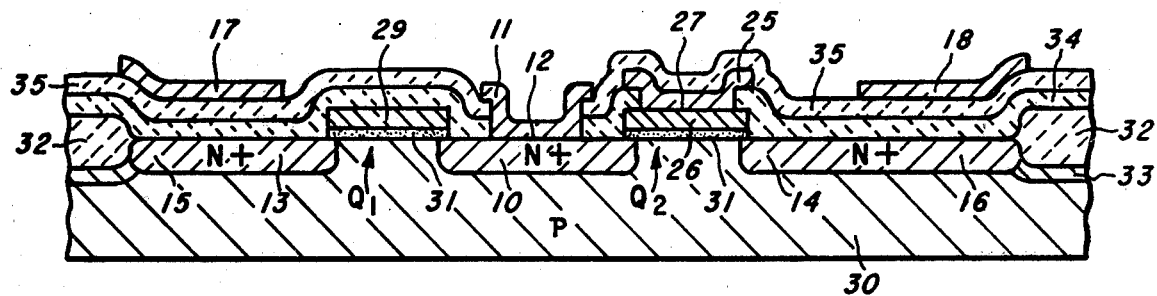
FIGS. 3a–3c are elevation views in section of the cell of FIG. 1, taken along the lines a—a, b—b, c—c, and d—d, respectively.
Figure 3B:
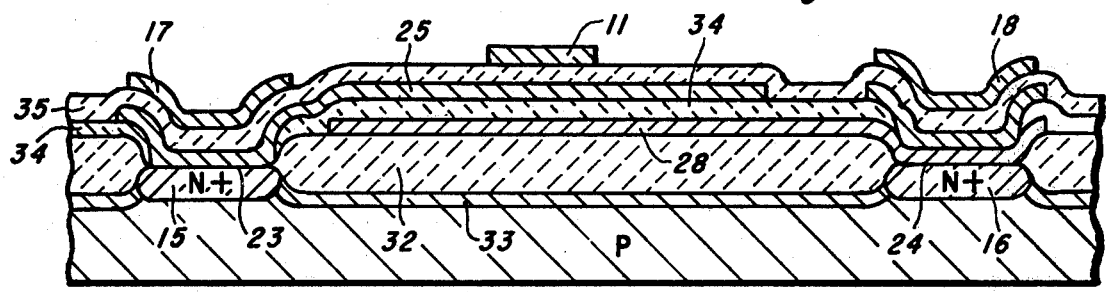
Figure 3C:
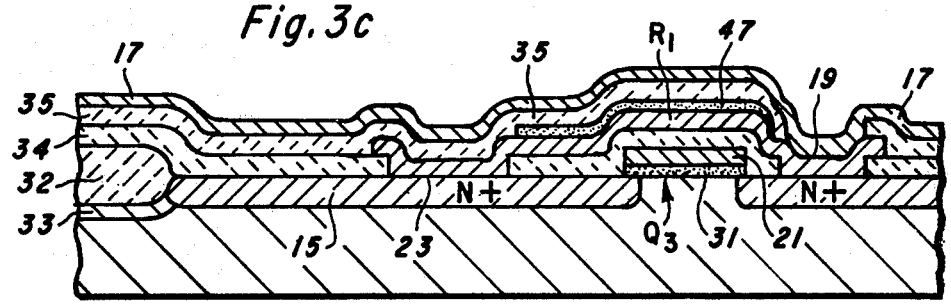

Referring to FIG. 1, 2 and 3a–3c, a static RAM cell according to the invention is illustrated. The cell includes two driver transistors Q1 and Q2 which share a common N+ source region 10 which is connected to a metal Vss or ground line 11 by a metal-to-moat contact 12. The drains 13 and 14 of the transistors Q1 and Q2 are connected via elongated N+ moat regions 15 and 16 and through the source-to-drain paths of the transistors Q3 and Q4 to D and $\overline{D}$ data lines 17 and 18 at contact areas 19 and 20, respectively. An X address line 21 crosses the transistors Q3 and Q4 and forms the gates 22 of these devices. Load resistors R1 and R2 formed in second level polycrystalline silicon in a manner disclosed in Ser. No. 801,699, filed May 31, 1977 are connected between the contact areas 19 and 20 and contacts 23 and 24 to provide the load resistors for the bistable circuit. The contacts 23 and 24 are formed by aperatures in the oxide to allow connection between the second level poly and the N+ silicon regions 15 and 16. A second level polycrystalline silicon strip 25 (a low resistance extension of the polysilicon forming resistor R1) forms the cross coupling connection from the contact 23 on the region 15 (drain 13 of transistor Q1) and the gate 26 of the transistor Q2 at a second-to-first level poly contact 27. Likewise, a first level poly strip 28 connects the contact area 24 on the N+ moat 16 to the gate 29 of the transistor Q1.

As seen in the section views of FIGS. 3a–3d, the cell is formed in a silicon bar 30 where N+ diffused regions in moat areas provide the source and drain regions 10, 13 and 14 as well as the interconnecting regions 15 and 16. Thin silicon oxide layer 31 provides the gate insulator for the transistors Q1–Q4, while a thick field oxide coating 32 covers all of the face of the bar except the moat areas. A P+ channel stop region 33 underlies all of the field oxide 32. The first level poly such as the gates 26 and 29 and the line 21 is insulated from the second level poly such as the resistors R1 and R2 by a silicon oxide layer 34 deposited at low temperature, and a similar layer 35 insulates the second level poly from the metal lines 11, 17 and 18. These layers 34 and 35 are referred to as interlevel oxide. A thick protective overcoating of oxide or glaze (not shown) would cover the metal in the usual manner.

According to the invention, the static RAM cell described above does not require a connection to a supply voltage Vcc or Vdd, and so an elongated metal, poly or N+ moat strip running the width of the array for each row or column is eliminated. Power must be supplied to the cell to keep the "on" transistor conducting, and this is accomplished by maintaining an intermediate voltage level in the D and $\overline{D}$ lines 18 and 19. During the steady state, standby condition when a read or write operation is not being conducted, all of the X or row lines 21 are low, at logic zero or Vss, and the D and $\overline{D}$ lines 18 and 19 are at about 2.5 to 3.0 v. The on transistor Q1 or Q2 in each cell will thus contact through R1 or R2, and the off transistor will be held off by the drop accross this resistor. During a read operation, one of the 128 or 256 X lines 21 will go high, the others remain at Vss, turning on transistors Q3 and Q4. The D and $\overline{D}$ lines 18 and 19 are isolated from the intermediate voltage source upon initiation of this read operation, and one or the other of these lines will tend to discharge through the transistor Q1 or Q2 which is conducting more heavily. Considered another way, one of the D or $\overline{D}$ lines will discharge toward Vss into the node 15 or 16, depending upon which of the transistors Q1 or Q2 is conducting more heavily. In either case, voltage differential can be detected by a sense amplifier such as that shown in U.S. Pat. No. 4,081,701, assigned to Texas Instruments, or any other sense amplifier of such type. The "zero going" D or $\overline{D}$ line is not allowed to discharge very far toward Vss as this ould destroy data in non-selected cells on this column or alternatively, the line would not be allowed to remain low long enough to disturb other cells on the column. The voltages on the data lines 18 and 19 are clamped at perhaps two volts in the first case. For a write operation, an X line 21 is driven high, the others low, just as in a read operation. Depending upon whether a one or a zero is to be written, one of the D or $\overline{D}$ lines is driven above the intermediate level and the other somewhat below it (still clamped at substantially above Vt, however, or limited in duration, as above). This is enough to cause the selected cell to switch to a stable state where one transistor Q1 or Q2 is conducting much more heavily than the other. Then, when the high voltage is removed from the X line 21 and the transistors Q3 and Q4 turn off, and the D and $\overline{D}$ lines 18 and 19 return to their intermediate level, the cell selected for write will go to a one or zero condition; the capacitance of one of the gates 26 or 27 causes the circuit to go to a condition where one of the transistors Q1 or Q2 is conducting and the other cut off.

Referring now to FIGS. 4a–4d, a process for making the N-channel silicon-gate, self-aligned, double-level poly, MOS integrated circuit device of FIGS. 1 and 3a–3c will be described. The starting material is a slice of P-type, monocrystalline semiconductor grade silicon, perhaps 3 inches in diameter. In the FIGURES, the wafer or body 30 represents a very small part of the slice, about one mil wide, chosen as a representative sample cross section. First, after appropriate cleaning, the slice is oxidized by exposing to oxygen in a tube furnace at an elevated temperature of perhaps 1000° C. to produce an oxide layer 41 of a thickness of about 1000 Å. Next a layer 42 of silicon nitride $Si_3N_4$ about 1000 Å thick is formed by exposing to an atmosphere of dichlorosilane and ammonia in a CVD reactor. A coating of photoresist is applied to the entire top surface, then exposed to ultraviolet light through a mask which defines the desired pattern, and developed, leaving areas where nitride is to be etched away and field oxide 32 is to be grown. Alternatively, smaller geometries and thus smaller cell sizes may be obtained by using electron beam lithography in place of uV light and glass masks to expose the photoresist, as disclosed in Bell Laboratories Record, March 1976, p. 69–72 and Electronic Products February 1977, p. 17. The slice is subjected to a plasma etch, which removes the part of the nitride layer 42 not covered by the developed photoresist, but does not remove the oxide layer 41 and does not react with the photoresist.

The slice is next subjected to an ion implant step, whereby boron atoms are implanted in the areas 44 of silicon not covered by the photoresist and the nitride 42, using the photoresist as an implant mask. Boron is an impurity which produces P-type conductivity, so more heavily doped P+ regions 45 will be produced in the surface to provide the channel stop regions 33. The oxide layer 41 is left in place during the implant because it prevents the implanted boron atoms from out-diffusing from the surface during subsequent heat treatment.

As will be seen, the regions 45 do not exist in the same form in the finished device, because some of this part of the slice will have been consumed in the oxidation procedure.

As set forth in U.S. Pat. No. 4,055,444 to G. R. Mohan Rao, assigned to Texas Instruments, the next step in the process is to subject the slice to a nitrogen annealling step, wherein the slice is maintained at a temperature of about 1000° C. for about 2 hours in nitrogen to reduce bulk damage in the crystal structure caused by implant.

The following step is formation of field oxide, which is done by subjecting the slices to steam or an oxidizing atmosphere at about 1000° C. for several hours. As seen in FIG. 4b, this causes a field oxide region or layer 32 to be grown to about 10,000 Å; this region extends into the silicon surface because silicon is consumed as it oxidizes. The nitride layer 42 masks oxidation beneath it. The boron doped P+ region 45 as previously implanted will be partly consumed, but will also diffuse further into the silicon ahead of the oxidation front to provide the P+ channel stop regions 33.

The nitride layer 42 and its underlying oxide layer 41 are removed by etching, as the next step, and another thin silicon oxide layer 31 of about 800 Å is grown over the exposed areas of silicon to provide the gate insulators. Windows for first level polysilicon to moat contacts are patterned and etched using photoresist, removing the gate oxide layer 31 in selected areas such as the contact areas 24. Next, a layer of polycrystalline silicon is deposited over the entire slice in a reactor using standard techniques, for example by decomposition of silane in hydrogen to a thickness of about 0.5 micron, producing the first-level polysilicon which is then patterned using photoresist to form the strips 21 and 28, and the gate 26. The resulting structure is seen in FIG. 4b. At the same time, using the photoresist which patterns the first level poly, the thin oxide 31 is removed in all exposed areas, leaving oxide only in the transistor gate areas.

Using the photoresist over the remaining first level polysilicon coating and thin oxide 31, as well as the field oxide, as an implant mask, the slice is now subjected to an N type implant. Arsenic is implanted and then driven into the silicon slice 30 to produce all of the N+ regions 10, 13, 14, 15, 16, etc. The depth of these regions is about 6000 Å. The N+ regions function as conductors which connect the various regions together, and also function as the source or drain regions of all the transistors. The arsenic renders highly conductive all of the exposed polysilicon areas such as gates 26 and 29, the strip 28, and the line 21, etc. In the poly-to-moat contact area 24, the N+ implant penetrates the poly and converts the underlying P-type silicon to N+ because here the oxide layer 31 has been removed.

Oxide is grown over the first level poly by thermal oxidation to produce a layer 46 of about 500 Å thickness. Then about 3000 Å of oxide is deposited at lower temperatures, producing the interlevel layer 34. The exposed silicon in the moat areas is oxidized so the layer 46 extends over the N+ regions 10, 13, 14, 15, 16, etc.

As seen in FIG. 4d, the oxide layer 49 is patterned using photoresist to open the contact areas 19, 20, 23, and 24 and the contact area 27, that is, all second-poly to first-poly or second-poly-to-moat contact areas. The second level of polycrystalline silicon is now deposited using a method as for the first level, providing a thickness of about 0.5 micron. The entire second-level polycrystalline silicon coating is subjected to a phosphorus implantation which creates the characteristics of the resistors R1 and R2. Areas of polysilicon which are to be highly conductive will be later subjected to a phosphorus diffusion which will leave them heavily doped. To define the resistor characteristics, this implant step is performed at 100 to 150 keV to a dosage of from $5 \times 10^{13}$ to $1 \times 10^{14}$ phosphorus atoms per cm$^2$, depending upon the desired sheet resistivity for the resistors. The phosphorus implant serves to produce a resistivity of ideally about one to five meghoms per square at 25° C. Lower resistivity results in too large cell size, and higher results in instability, non-reproducibility and excessive voltage dependence. The second level-polysilicon coating is next patterned, using photoresist, the remaining polysilicon layer providing the resistors R1 and R2 and the strip 25. No transistor gates are created by this layer of polycrystalline silicon, and indeed it overlies transistor gates.

After patterning the second level polysilicon a protective cap of silicon dioxide is grown on the polysilicon, producing a coating 47 on all exposed surfaces of the poly, including tops and sides. The coating 47 is grown at about 900° C. in steam for about two hours, producing approximately 2500 Å thickness and consuming part of the polysilicon. The function of the cap is to prevent deposition of impurities on the resistors or diffusion into the resistors. A photoresist masking and etching operation is then used to remove the coating 47 from areas of polysilicon which are to be diffused; it is left in place over the resistors R1 and R2. The masked second-level poly is then subjected to a phosphorus deposition and diffusion, rendering the areas not covered by the oxide 47 highly conductive.

Fabrication of the device is continued by depositing a thick layer 35 of phosphorus-doped oxide. Rather than by oxidizing, this is done by a low temperature reaction process using conventional chemical vapor deposition techniques producing a layer 35 of about 10,000 Å convering the entire slice. This deposition is followed by a "densification" step wherein the slice is heated at 1000° C. for the purpose of eliminating minute holes or pores in the oxide. Subsequently, a photoresist operation opens windows in the oxide layer 35 in areas 12, 19 and 20 where contact is to be made from metal to the N+ silicon regions or moat areas. Then a film of polysilicon is deposited over the slice to avoid aluminum silicate spikes, and a layer of aluminum is deposited on the entire slice and selectively etched using photoresist masking to produce the desired pattern of metal strips 11, 17 and 18.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A static memory cell comprising a pair of cross-coupled driver transistors, a pair of coupling transistors, each of the transistors being an insulated gate field effect transistor and having source and drain regions and a gate electrode, a pair of data lines, means connecting the data lines to drain regions of the driver transistors via source and drain regions of the coupling transistors, means for addressing the cell by voltage on the gate electrodes of the coupling transistors, and a pair of resistors to apply a voltage to the data lines to provide supply voltage to the cell during time when the coupling transistors are not addressed, one of the resistors being connected in parallel with each of the coupling transistors, the transistors and resistors all being formed at a face of a body of semiconductor material, the gate electrodes being formed in a first level of polycrystalline silicon on said face and the resistors are formed in a second level of polycrystalline silicon on said face, the second level at least partly overlying the first level so that the resistors overlie the coupling transistors.

2. A cell according to claim 1 wherein the source regions of the driver transistors are connected in common to reference potential.

3. A cell according to claim 1 wherein the voltage applied to the data lines is intermediate between a supply voltage level and reference potential, and is above the threshold voltage of the driver transistor.

* * * * *